United States Patent
Bhavnagarwala et al.

(10) Patent No.: US 6,788,566 B1
(45) Date of Patent: Sep. 7, 2004

(54) SELF-TIMED READ AND WRITE ASSIST AND RESTORE CIRCUIT

(75) Inventors: Azeez J. Bhavnagarwala, Newtown, CT (US); Stephen V. Kosonocky, Wilton, CT (US); Rajiv V. Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/694,698

(22) Filed: Oct. 28, 2003

(51) Int. Cl.$^7$ .............................................. G11C 11/00
(52) U.S. Cl. ...................... 365/154; 365/201; 365/156; 365/230.06; 365/189.01
(58) Field of Search ................. 365/154, 156, 365/201, 230.06, 189.01

(56) References Cited

U.S. PATENT DOCUMENTS 5,835,429 A * 11/1998 Schwarz ..................... 365/201
6,314,048 B1 * 11/2001 Ishikawa ............... 365/230.06

* cited by examiner

Primary Examiner—Connie C. Yoha
(74) Attorney, Agent, or Firm—Keusey, Tutunjian & Bitetto, P.C.; Louis J. Percello

(57) ABSTRACT

A read and write assist and restore circuit for a memory device includes a first device, which is responsive to a potential on a bit line such that the potential on the bit line activates the first device. A second device is driven by the first device such that when the first device is activated, a change in the bit line potential is reinforced with positive feedback by the second device during a wordline active period to enable write-back of data lost as a result of threshold voltage fluctuations in memory cell transistors coupled to the bit line.

19 Claims, 6 Drawing Sheets

US 6,788,566 B1

SELF-TIMED READ AND WRITE ASSIST AND RESTORE CIRCUIT

BACKGROUND OF THE INVENTION

1. Field of the Invention

The present invention relates to random access memory technology and architecture, and more particularly to tolerating large threshold voltage fluctuation in memory cells.

2. Description of the Related Art

Large threshold voltage (Vt) fluctuations due to random placement of dopant atoms in small geometry static random access memory (SRAM) cell metal oxide semiconductor field effect transistors (MOSFETs) significantly degrades SRAM array yields in functionality and performance. Presently, there are no known circuit solutions to address this limitation other than brute force reverse scaling of SRAM cell transistor geometries and cell size. One drawback of the reverse scaling approach is that it increases the production cost of the device by increasing die size significantly. Thus, making high performance processors more expensive.

Therefore, a need exists for a structure and method, which counters the negative effects threshold voltage fluctuation in memory cells.

SUMMARY OF THE INVENTION

A read and write assist and restore circuit for a memory device includes a first device, which is responsive to a potential on a bit line such that the potential on the bit line activates the first device. A second device is driven by the first device such that when the first device is activated, a change in the bit line potential is reinforced with positive feedback by the second device during a wordline active period to enable write-back of data lost as a result of threshold voltage fluctuations in memory cell transistors coupled to the bit line.

Another read and write assist and restore circuit for a memory device includes sensing device responsive to a potential on a bit line such that the potential on the bit line activates the sensing device, and a driver device driven by the sensing device such that when the sensing device is activated, a change in the bit line potential is reinforced with positive feedback by the second device during a wordline active period to enable write-back of data lost as a result of threshold voltage fluctuations in memory cell transistors coupled to the bit line. A virtual ground provides a higher potential than a global ground to the memory cell transistors to assist in write operations and during standby.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention captures data being read by a bit line (BL) from a memory cell, before the cell asymmetries due to Vt fluctuations upset the cell. The captured data is restored to the cell while the word line (WL) is still selected, enabling the cell to retain data that would be otherwise lost.

It should be understood that the present invention will be illustratively described in terms of an SRAM cell; however, the present invention is much broader and can be used with other memory storage devices, such as register files and DRAM or even other storage or capacitive elements that are affected by threshold voltage fluctuations.

Figure 1:
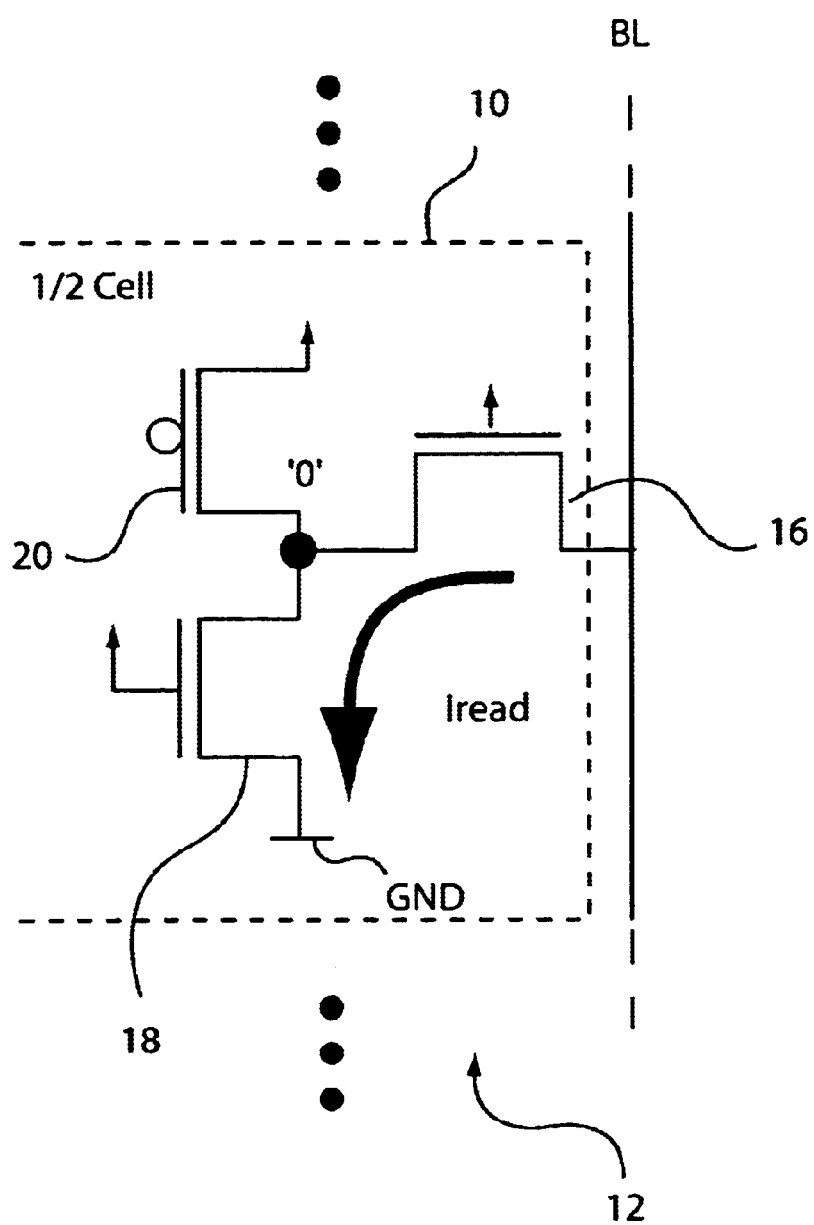
FIG. 1 is a schematic diagram conceptually showing operation of a memory cell, during a read operation.

Referring now to the drawings in which like numerals represent the same or similar elements and initially to FIG. 1, a half (½) cell 10 is illustratively shown to demonstrate the operation of the present invention. Cell 10 may be any type memory cell, e.g., SRAM, DRAM or other memory cell. In FIG. 1, cell 10 includes an SRAM cell having a plurality of MOSFETs. Cell 10 is preferably included in an SRAM memory circuit 12 in a memory array region. Although, memory cell 10 may be include as a single device, for example, on an application specific integrated circuit. In an array region, circuit 12 includes a plurality of cells 10.

Half cell 10 shows three transistors, however a full cell may include six transistors. PFETs and NFETs may be switched as would be known to one skilled in the art.

The present invention uses devices having a threshold voltage Vt. A word line (WL) is included in the gate of device 16 and is activated with a supply voltage, Vdd, by the word line (WL). When the WL selects a row of cells, each cell begins pulling down (one of 2) precharged BLs with its cell read current Iread.

In a conventional SRAM, the cell storage node at '0' rises to a voltage determined by a voltage divider between the precharged BL and the cell ground GND across cell transistors 16 and 18. If the Vt of the cell access transistor, 16 is smaller due to a Vt fluctuation, and/or if the pull-down transistor 18 has a larger Vt due to random Vt variations, then the node at '0' rises high enough to potentially trip an inverter (e.g., device 18 and 20 form an inverter on the half of the cell shown, a mirror image is included on the other half) formed by the transistors (not shown) on the other half of the cell. The positive feedback between the two cell inverters then ensures that the cell flips state and the data originally stored is lost.

The present invention uses the fact that the cell with severe Vt fluctuation takes a finite time to flip. This time will be referred to as Tdata. Tdata is usually long enough for the BL pair driven by the unstable cell to capture the data from the cell that is sinking read current (Iread) and developing a differential voltage signal across the BL pair. A more unstable cell is also faster (smaller Vt in access devices degrades cell stability and increases read current). Vt increases in the cell transistor 18 do not affect the node voltage at '0' as much as transistor 16 does. In addition, Vt increases in transistor 18 do not occur as often as Vt decreases do, since the skew in the Vt distribution favors smaller Vt from short channel effects.

Figure 2:
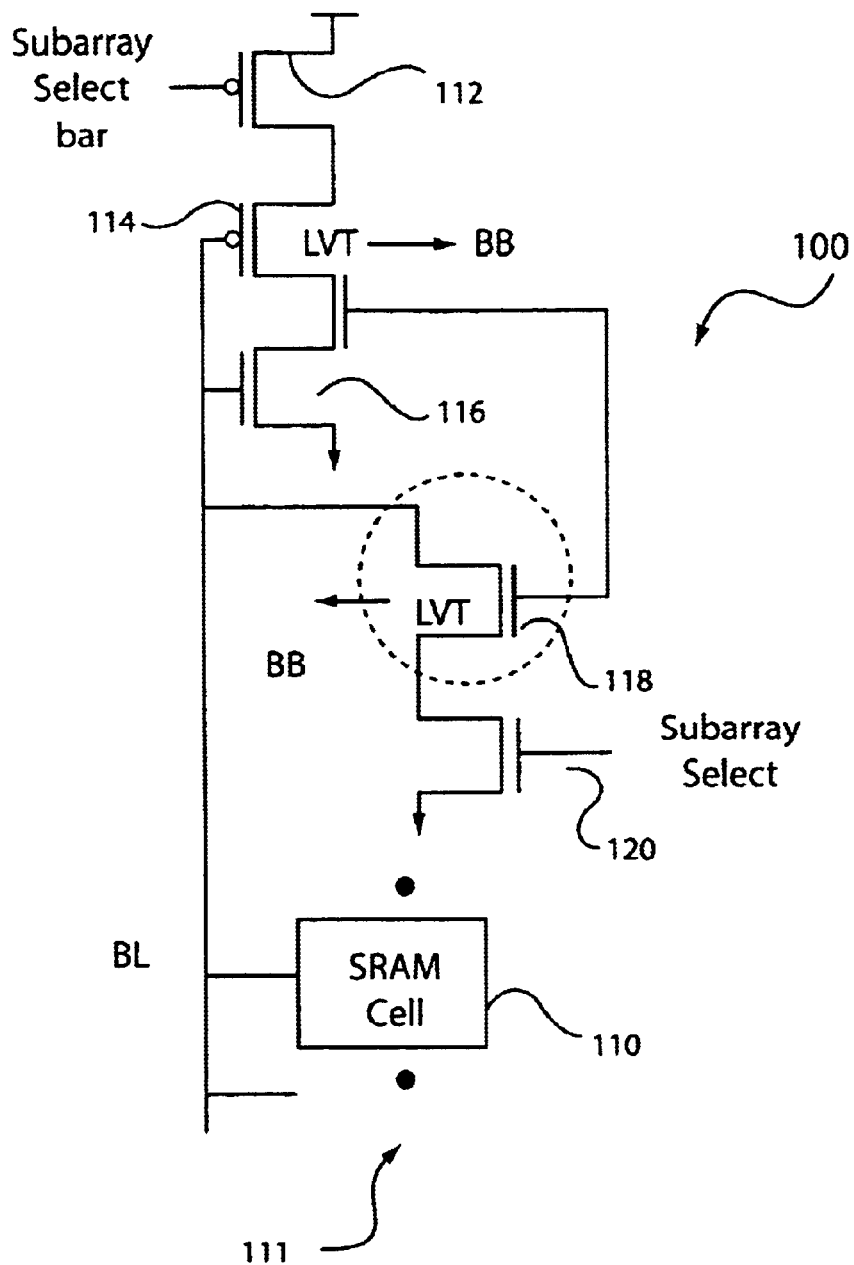
FIG. 2 is a schematic diagram showing a read and write assist and restore circuit in accordance with an illustrative embodiment of the present invention.

Referring to FIG. 2, a self-timed read and write assist and restore circuit 100 is shown in accordance with one illustrative embodiment of the present invention. Circuit 100 may be placed within an array of cells 110 and is coupled to a bit line BL. During operation, transistors 112 and 120 are enabled by a subarray select bar signal and a subarray select signal, respectively. Once activated, a faster cell (unstable cell with a large Vt fluctuation) in subarray 111 sinks BL charge, dropping the BL voltage. At the same time, this charge drop activates a transistor 114. Transistor 114 has a gate connected to BL, which turns on the PFET 114 when the BL voltage drops below its threshold. PFET 114 in turn drives a device (NFET) 118, which, on turning on begins to 'assist' a selected SRAM cell in developing signal on the BL. Transistors 114 and 118 are preferably low threshold voltage device (LVt) or may have their threshold voltages adjusted during fabrication to handle predetermined condition on BL.

Advantageously, feedback action is provided in the assist circuitry 100, which is self-timed in that there is no external signal that is needed to initiate this feedback mechanism. The feedback is initiated by the voltage of the BL itself. The sensitivity of the feedback to the BL voltage is controlled by body bias (BB) on the well of the PFET 114 or the well of the PFET 114 and the NFET 118.

In the embodiment shown, the read assist mechanism is gated by the sub-array select and subarray-select-bar signals also shown below so that the feedback can be invoked only when the subarray is selected. Note also that the feedback does not degrade the write operation. Instead, the feedback 'assists' the write in providing the write buffers with more drive, potentially relaxing their drive strength requirements.

Figure 3:
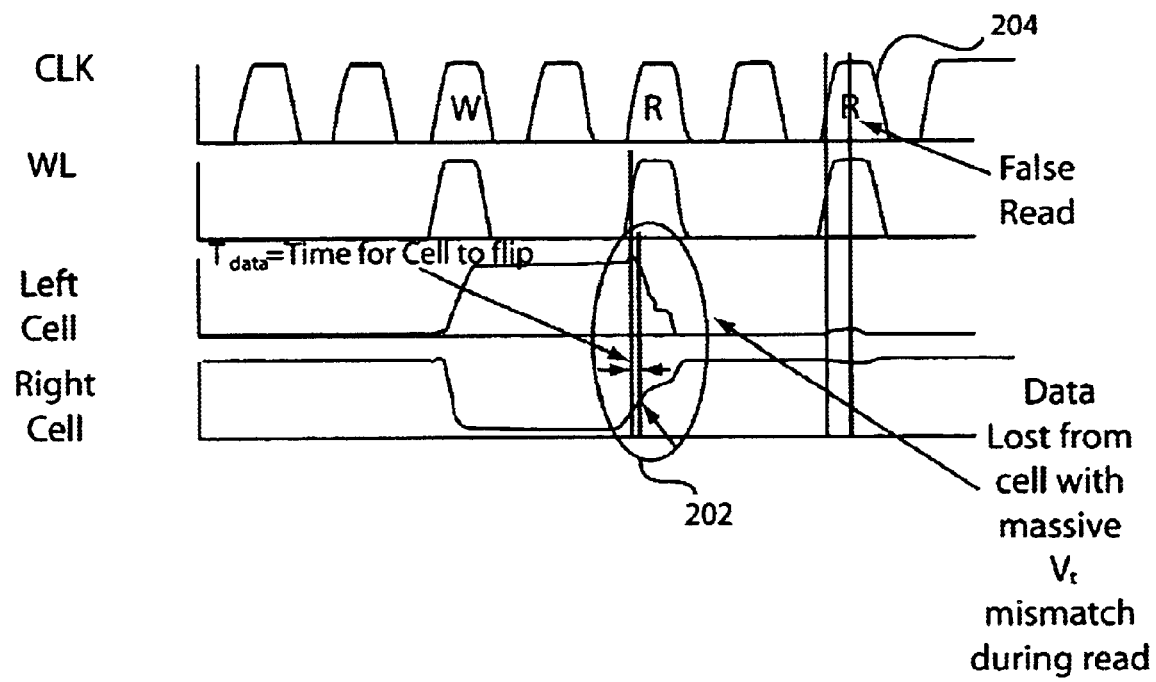
FIG. 3 is a timing diagram for a simulation of a prior art SRAM cell showing data loss.

Referring to FIG. 3, a conventional SRAM cell simulation is shown without read assist or the present invention. The circuit simulation demonstrates the read upset due to Vt mismatch in a conventional SRAM cell. According to FIG. 3, data is lost on the left bit line (left BL) as indicated in a region marker 202. A CLK signal shows the read (R) and write (W) cycles. WL shows the word line signal. Left cell and right cell show the data signals for storage in a given half of a cell. Tdata is the time needed for a cell to flip. In the flip region, static noise margin (SNM)=0, and the voltage at node '0' (see e.g., FIG. 1) is greater than Vcritical (Vcrit). Vcrit is the minimum node voltage needed to trip the cell state. As a result of the reduced bit line voltage a false read cycle was experienced as indicated by label 204.

Figure 4:
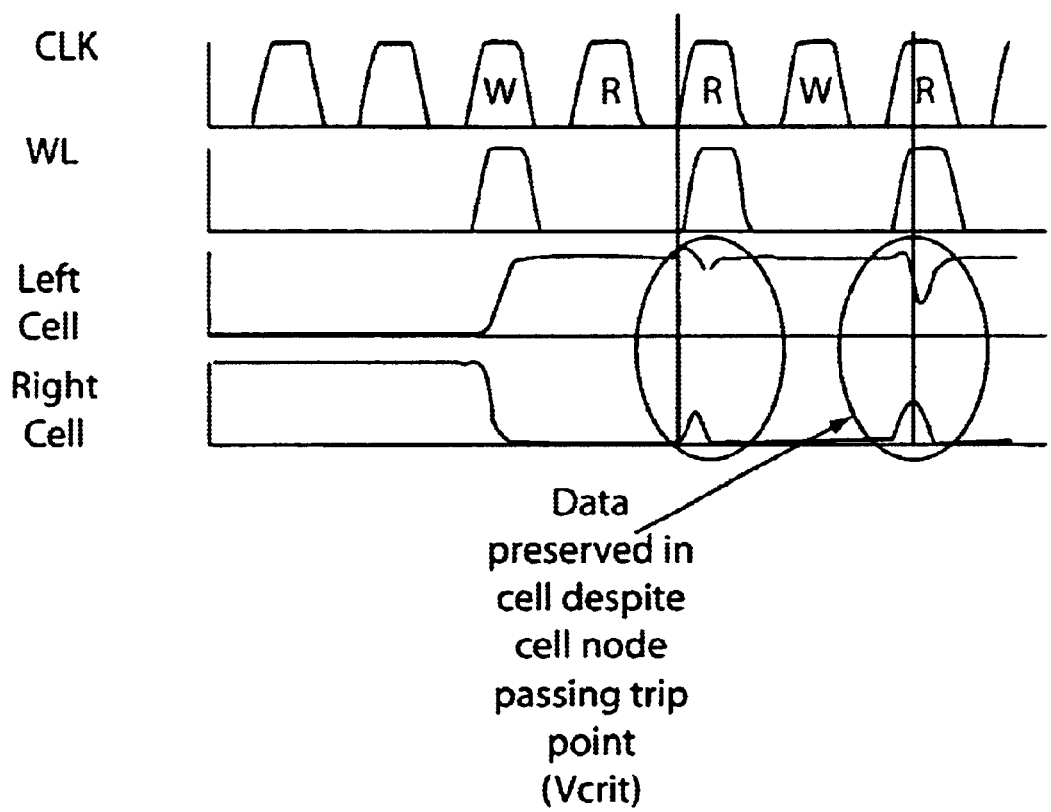
FIGS. 4 and 5 are timing diagrams for a simulation of a circuit employing a read and write assist and restore circuit of the present invention.
Figure 5:
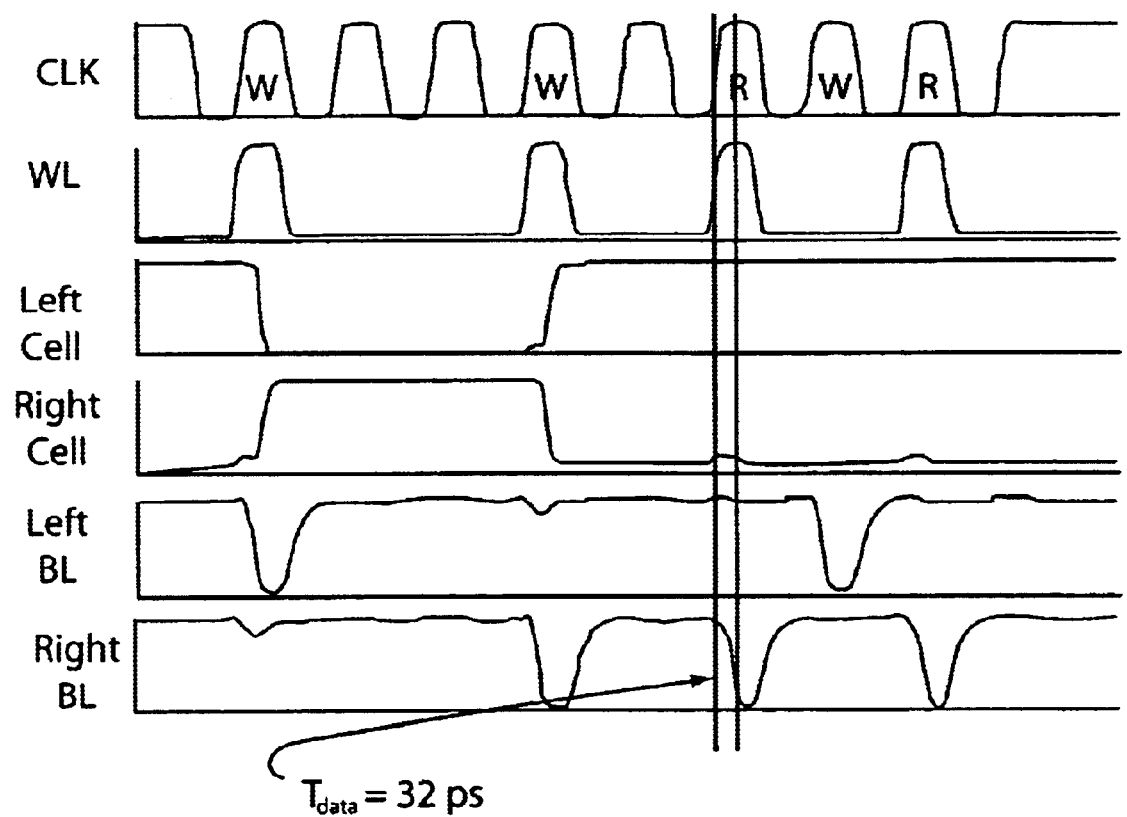

Referring now to FIG. 4, a simulation of an identical SRAM cell with read assist in accordance with the present invention is shown. The simulation of FIG. 4 demonstrates that the cell is able to hold data even in the presence of large Vt variations (e.g., despite Vnode exceeding Vcrit). As shown in FIG. 5, the symmetrical matched SRAM cell simulation with the addition of read assist circuitry shows that performance is maintained using read assist circuitry of the present invention. FIG. 5 shows bit line timing for right and left BL signals.

Write Assist using SRB

Referring again to FIG. 1, the noise margin for a write operation is smaller when Vt of the cell access transistor increases. This is because, the cell node at '0' is being held low by the pull-down NFET 18, which fights the pull-up device 20 of the write driver that is trying to write a '1' to that node. If the cell access transistor Vt is large enough, then there will be enough of a voltage drop across 16 to inhibit the write driver 20 from raising the voltage of the node at '0' making it harder to write data into the cell.

However, on keeping the cell ground voltage(VGND) higher than ground (GND) during a write operation, the cell pull-down NFET 18 is much weaker because its gate-source voltage is smaller, making it easier for the write driver 20 to flip the cell, large Vt variation in the cell access transistors notwithstanding.

Figure 6:
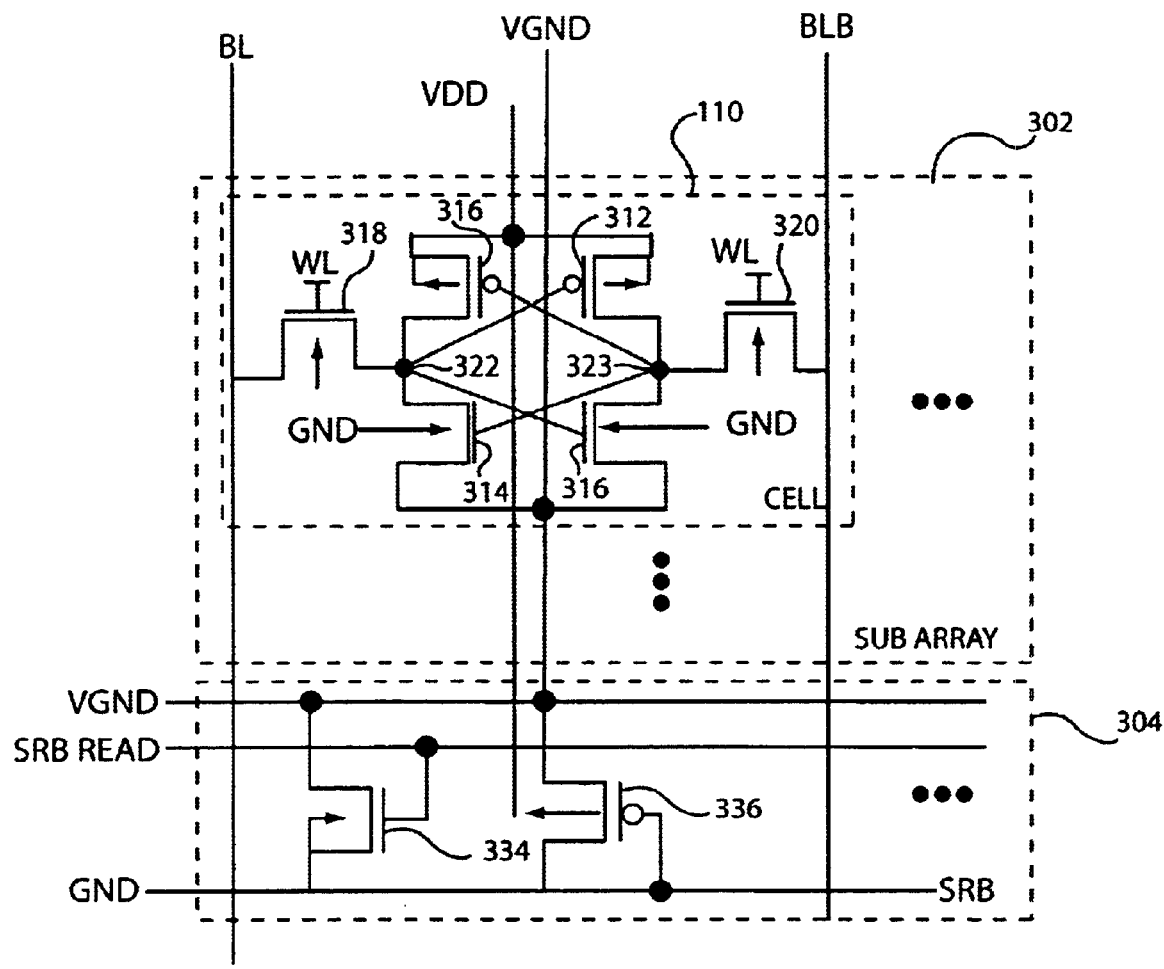
FIG. 6 is a schematic diagram showing a virtual ground enabling circuit in accordance with an illustrative embodiment of the present invention.

The write assist operation may be implemented using a technique disclosed with reference to FIG. 6 by not activating a SRB READ signal for write operations and during standby. This ensures that the VGND stays at Vt above ground during writes and during standby.

Referring to FIG. 6, a schematic diagram provides an illustrative model circuit to explain VGND for write operations in accordance with the present invention.

In a logic portion 304 of circuit 300, a virtual ground line VGND connects to VGND of array 302. VGND is coupled to global ground GND via one or more transistors 334 and 336. Transistor 334 may include an NFET which has its gate controlled by an SRB (self-reverse bias) signal. Transistor 336 may include a PFET which has its gate controlled by an SLP_mode ("sleep" mode) signal.

During idle mode, nodes 322 (and 323) store a one or a zero. In conventional systems, leakage through NFETs 314 and 316 to GND caused charge (ones) from storage nodes 322 (and 323) to discharge. By employing VGND at a value greater than GND, leakage is reduced. Transistor 336 acts as a diode in pinning the VGND at a voltage (e.g., Vt above GND). Hence, charge that builds up in VGND during idle mode increases the potential of VGND. When the VGND potential exceeds a threshold value, charge leaks through to GND, through device 336 thereby pinning the voltage, which can build up on VGND. Cell 110 includes transistors 310–320 for operations of the SRAM cell as described above (see e.g., FIG. 1) with the assist circuitry of FIG. 2 in accordance with the present invention. Note BLB is bit line bar.

Having described preferred embodiments of self-timed read and write assist and restore circuit (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A read and write assist and restore circuit for a memory device, comprising:
   a first device being responsive to a potential on a bit line such that the potential on the bit line activates the first device; and
   a second device driven by the first device such that when the first device is activated, a change in the bit line potential is reinforced with positive feedback by the second device during a wordline active period to enable write-back of data lost as a result of threshold voltage fluctuations in memory cell transistors coupled to the bit line.

2. The circuit as recited in claim 1, further comprising a select circuit, which selectively enables the circuit.

3. The circuit as recited in claim 1, further comprising a virtual ground, which includes a higher potential than a global ground to assist in write operations.

4. The circuit as recited in claim 3, wherein the virtual ground is pinned to a voltage above ground potential during write operations and standby.

5. The circuit as recited in claim 3, wherein the virtual ground is connected to the global ground through a transistor device to collapse a difference in potential between the global ground and the virtual ground during read access mode.

6. The circuit as recited in claim 1, wherein the first device includes a transistor and a gate of the transistor is coupled to the bit line.

7. The circuit as recited in claim 1, wherein the second device includes a transistor and a gate of the transistor of the second device is coupled to a supply voltage through the first device.

8. The circuit as recited in claim 1, wherein the second device assists the bit line by discharging current from the bit line when the second device is activated.

9. The circuit as recited in claim 1, wherein the first device is self-timing such that the first device is only active when the first device senses changes in bit line voltage.

10. The circuit as recited in claim 1, wherein the first and second devices include body biased transistors.

11. A read and write assist and restore circuit for a memory device, comprising:
   a sensing device responsive to a potential on a bit line such that the potential on the bit line activates the sensing device;
   a driver device driven by the sensing device such that when the sensing device is activated, a change in the bit line potential is reinforced with positive feedback by the second device during a wordline active period to enable write-back of data lost as a result of threshold voltage fluctuations in memory cell transistors coupled to the bit line; and
   a virtual ground, which provides a higher potential than a global ground to the memory cell transistors to assist in write operations and during standby.

12. The circuit as recited in claim 11, further comprising a select circuit, which selectively enables the circuit.

13. The circuit as recited in claim 11, wherein the virtual ground is pinned to a voltage higher than ground potential during write operations and standby.

14. The circuit as recited in claim 11, wherein the virtual ground is connected to the global ground through a transistor device to collapse a difference in potential between the global ground and the virtual ground during read access mode.

15. The circuit as recited in claim 11, wherein the sensing device includes a transistor and a gate of the transistor is coupled to the bit line.

16. The circuit as recited in claim 11, wherein the driver device includes a transistor and a gate of the transistor of the driver device is coupled to a supply voltage through the sensing device.

17. The circuit as recited in claim 11, wherein the driver device assists a selected memory cell by discharging current from the bit line when the driver device is activated.

18. The circuit as recited in claim 11, wherein the sensing device is self-timing such that the sensing device is only active when the sensing device senses sufficient voltage change in the bit line.

19. The circuit as recited in claim 11, wherein the sensing and driver devices include body biased transistors.

* * * * *